United States Patent [19]
Byrd

[11] Patent Number: 5,707,249
[45] Date of Patent: Jan. 13, 1998

[54] DEVICE HOLDER ATTACHING TO A PRINTED CIRCUIT BOARD

[75] Inventor: Timothy J. Byrd, Goffstown, N.H.

[73] Assignee: Schneider Automation Inc., Andover, Mass.

[21] Appl. No.: 600,191

[22] Filed: Feb. 12, 1996

[51] Int. Cl.⁶ .................................................... H01R 3/00
[52] U.S. Cl. ...................... 439/500; 439/56; 361/767
[58] Field of Search ............................. 439/68, 500, 69, 439/79, 80, 567, 354; 361/767

[56] References Cited

U.S. PATENT DOCUMENTS

| | | | |
|---|---|---|---|
| 3,181,974 | 5/1965 | Barbera | 439/123 |
| 3,881,961 | 5/1975 | Nation | 439/500 |
| 4,083,011 | 4/1978 | Ferrell et al. | 325/352 |
| 4,329,008 | 5/1982 | Braginetz | 439/80 |
| 5,211,579 | 5/1993 | Seong et al. | 439/500 |
| 5,395,263 | 3/1995 | Sandell | 439/500 |
| 5,518,424 | 5/1996 | Douty et al. | 439/500 |

*Primary Examiner*—Neil Abrams
*Assistant Examiner*—T. C. Patel
*Attorney, Agent, or Firm*—Ware, Fressola, Van Der Sluys & Adolphson LLP

[57] ABSTRACT

A device holder (25) holds a device (27, 28) in spaced relation to a printed circuit board (30), sufficient space (43) being provided between the printed circuit board (30) and the device (27, 28) for mounting of circuit components (47,49) on the printed circuit board (30) between the device holder and the printed circuit board. A connection is provided between a connector (85) mounted on the printed circuit board (30) and a connector (82) mounted on leads (78) which are attached to the device (27, 28), the connection providing for the electrical connection and disconnection of the device (27, 28) and the printed circuit board (30). A housing (10) is provided for mounting the printed circuit board (30), device holder (25) and device (27, 28) therein. The device holder (25) is provided with a deformable retention clip (56) for retention of the device (27) within a chamber (51) of the device holder (25), and in response to actuation by an operator, removal of the device from the device holder.

26 Claims, 5 Drawing Sheets

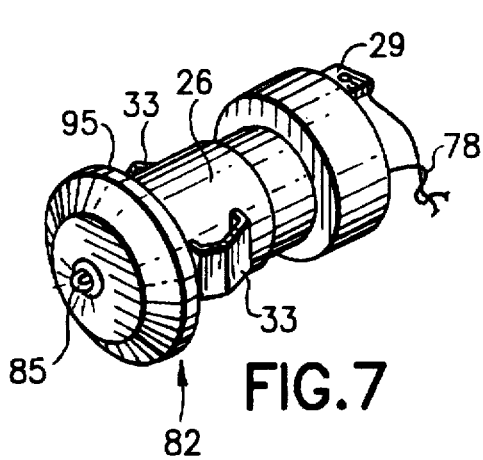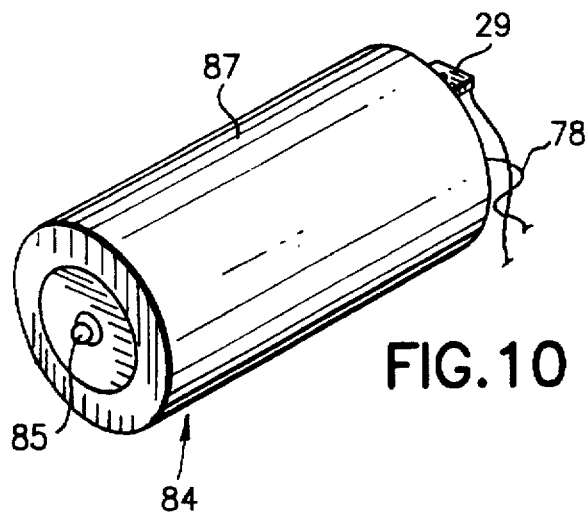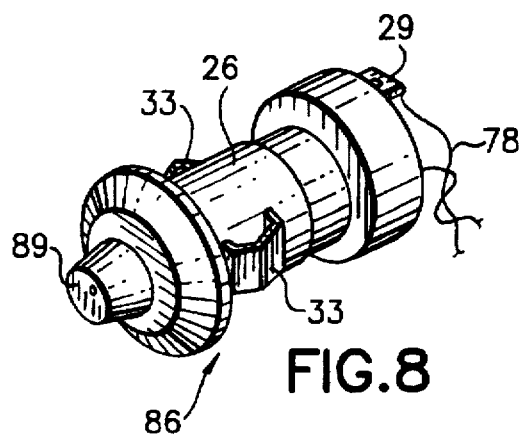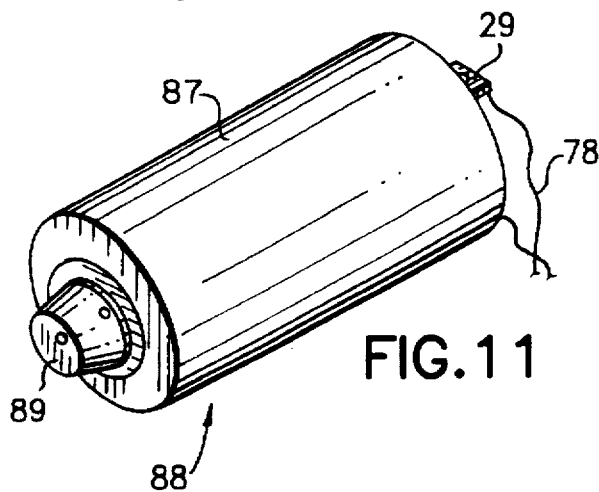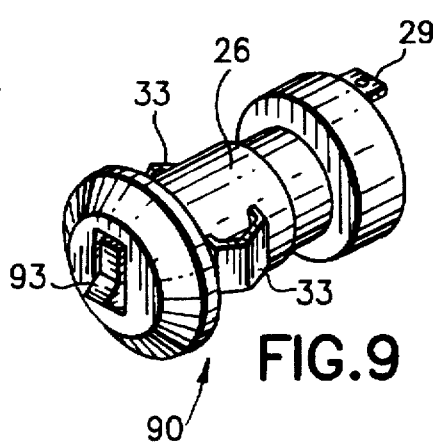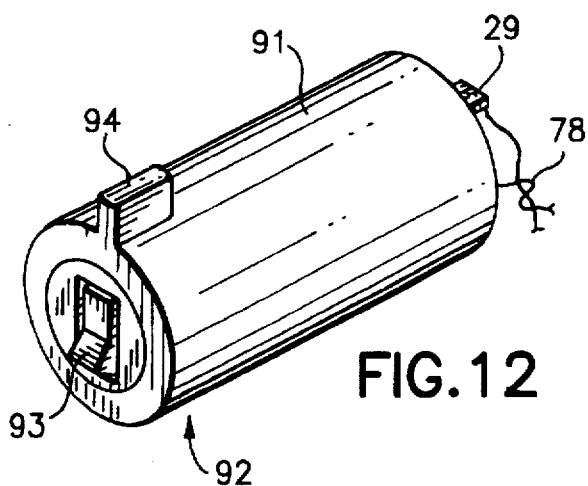

DEVICE HOLDER ATTACHING TO A PRINTED CIRCUIT BOARD

TECHNICAL FIELD

The present invention relates to a holder for holding devices used in connection with a printed circuit board and not normally part of the printed circuit, the holder holding the device in spaced relation to the printed circuit board.

BACKGROUND OF THE INVENTION

Often a printed circuit board has mounted on it components that require primary or backup power supply from a battery, and it is often useful to enable or disable the supply of power using a keyswitch, or to indicate the status of the supply of power (fully charged or otherwise). Other times it is useful to attach to a circuit board two or more devices neither of which is a battery, but yet which have a function related to the operation of the printed circuit board.

In the case of supplying battery power to a printed circuit board, one method is to provide a battery at a separate or remote location from the printed circuit board and provide a connector on the printed circuit board for connection to leads from a device holder wherein the battery is mounted.

Similarly, it may be desirable to control the operation of a circuit on the printed circuit board with a device, such as a key switch, on/off switch, rheostat, etc. It is well known to mount such devices remotely from the printed circuit board. One problem associated with a configuration of this type—devices mounted remotely—is that in most printed circuit board applications space is a major concern, and providing the device holder and battery or other device separate from the printed circuit board may consume more space than desired. Additionally, long lengths of wires or leads from the device holder to the printed circuit board may increase undesired resistance losses. Finally, if the printed circuit board is provided as a module, the separation of the device holder and printed circuit board may increase the overall size of the module.

Also in the case of providing battery power to a printed circuit board, another method is to provide a device holder directly mounted on a printed circuit board. However, a battery is typically large in comparison to other components mounted on a printed circuit board, and may take up a large amount of space that could be otherwise allocated to circuit components.

DISCLOSURE OF THE INVENTION

Objects of the invention include providing a device holder that attaches to a printed circuit board—the device holder for holding a device in spaced relation to the printed circuit board thereby allowing for the mounting of circuit components between the device and the printed circuit board—and providing for an electrical connection between each device being held and the printed circuit board.

A still further object of the present invention is to provide a device holder that attaches to a modular printed circuit board, the module providing for easy access for the installation and removal of devices being held by the device holder, and the device holder allowing the mounting of components on the printed circuit board between the printed circuit board and the devices.

According to the present invention, a device holder holds devices in spaced relation to a printed circuit board, the holder providing sufficient space between the printed circuit board and a held device—the devices received within a chamber of the holder—for mounting of circuit components on the printed circuit board between the holder and the printed circuit board.

In further accord with the present invention, a connection is provided between a connector mounted on the printed circuit board and a connector mounted on leads which are attached to the held device, the connection providing for the electrical connection and disconnection of the held device and the printed circuit board.

In still further accord with the present invention, a housing is provided for mounting the printed circuit board, device holder and device therein, the housing having an access for connection of the printed circuit board to a back plane, the housing further providing access to the holder and printed circuit board connection for insertion of the device into the holder and connection of the connectors for each device to the printed circuit board connectors for each device and also for removal of the device from the holder and disconnection of the connectors from the printed circuit board connectors.

According still further to the present invention, the holder may be provided with a deformable retention clip for retention of a device held by the holder, and in response to actuation by an operator, removal of the device from the holder without having to remove the holder from a housing.

Alternatively, the device may be provided with press spring fins for snap-fit engagement with the device holder, the device intended for removal as needed, or for permanent holding by the device holder.

The device holder of the present invention provides a significant improvement over the prior art by allowing the mounting of a device within a holder on a printed circuit board so that circuit components can be mounted on the printed circuit board between the device and the printed circuit board. Additionally, the holder allows for the secure retention of the device within the holder, and for either permanent holding or for easy removal of the device from the holder. The holder may provide for easy removal of a device by various designs, including use of a retention clip that an operator can move out of the entry way to a chamber of the device holder, and so make possible the insertion or removal of a device from the chamber. Another simple mechanism providing for easy insertion and removal of a device would make use of press spring fins, one on each side of the device, that are pressed closer to the side of the device while the device is first being inserted or first being removed. These fins would then be free to push further out from the side of the device when it is fully inserted into an appropriately shaped chamber or fully withdrawn from the chamber.

Snap fit connection is also provided between a connector mounted on the printed circuit board and connectors mounted to leads attached to the device for electrical connection of the printed circuit board and the device. A housing may be provided for retaining the printed circuit board, holder and device. The housing allows easy access to the holder, device and connectors so that each device may be easily installed or removed from the device holder and electrical connection may be established or removed from the device and the printed circuit board without removing the printed circuit board from the housing.

The foregoing and other objects, features and advantages of the present invention will become more apparent in light of the following detailed description of exemplary embodiments thereof, in view of the accompanying drawings.

3 invention, showing an access door of the housing open for allowing access to the device holder of the present invention.

Figure 2:
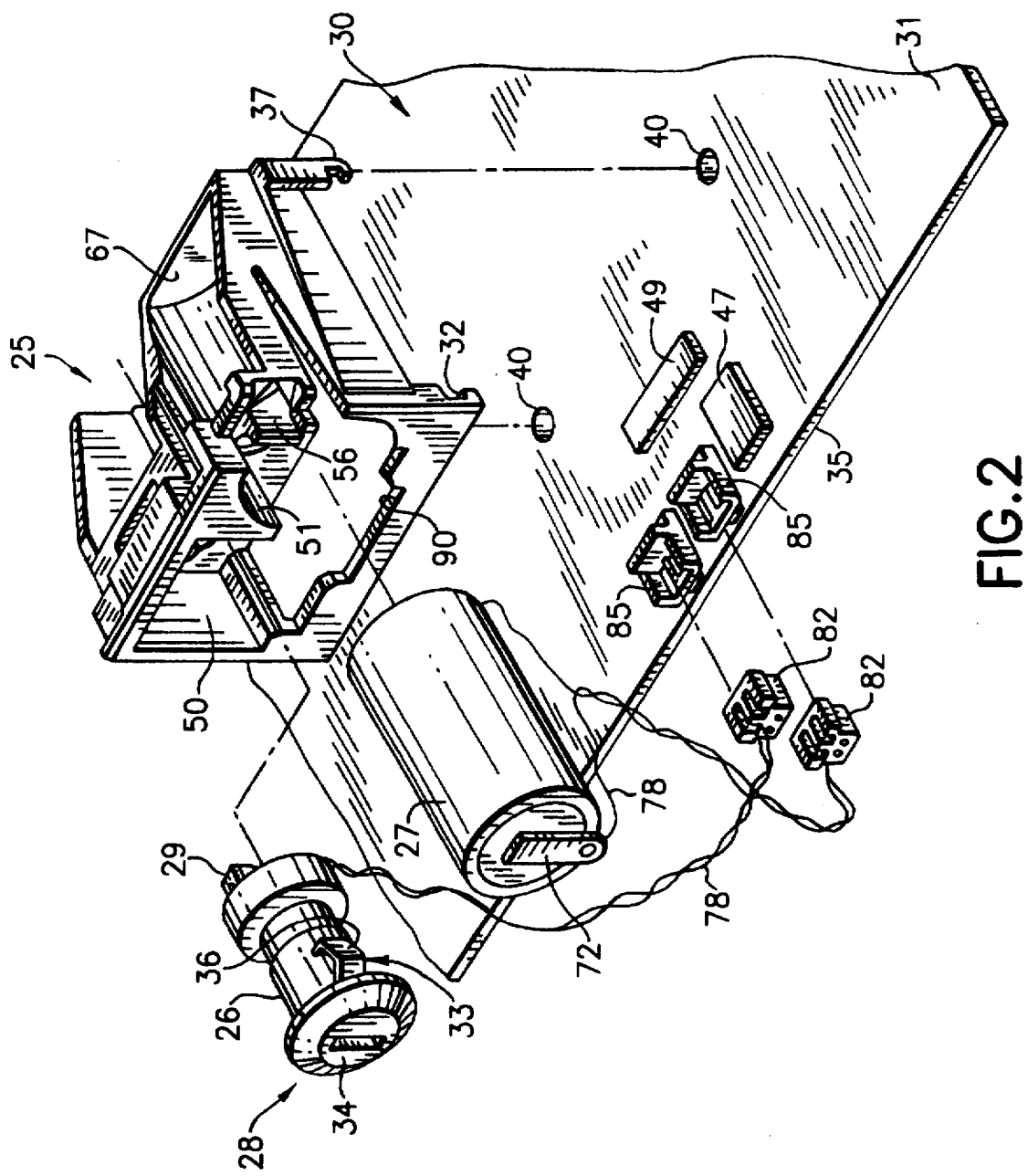

FIG. 2 is an exploded perspective view of the device holder, partially broken away, in relation to a printed circuit board, and also showing a battery and a keylock for insertion in the device holder and connectors for establishing an electrical connection between the battery and the printed circuit board and between the keylock and the printed circuit board.

Figure 3:
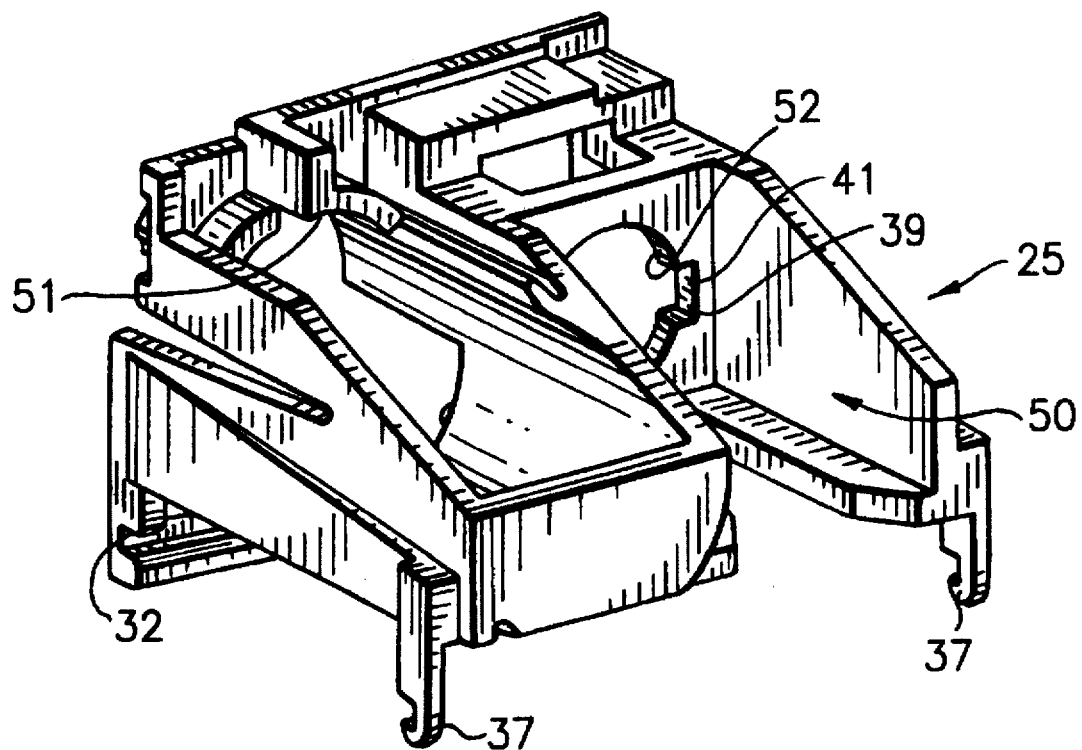

FIG. 3 is a rear perspective view of the device holder of FIG. 2.

Figure 4:
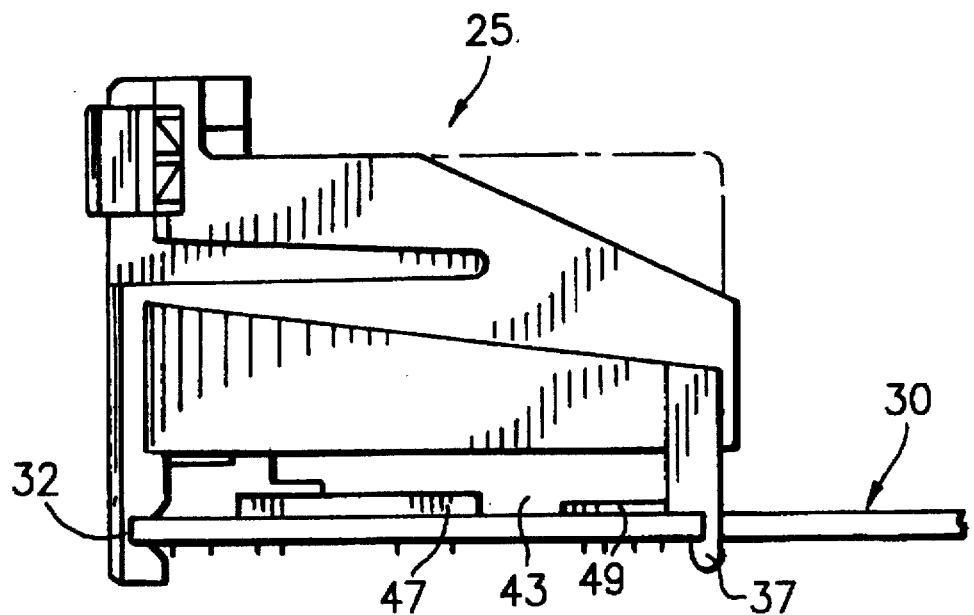

FIG. 4 is a side view of the device holder of FIG. 2 mounted on the printed circuit board of FIG. 2, showing circuit components mounted beneath the device holder and on the printed circuit board.

Figure 5:
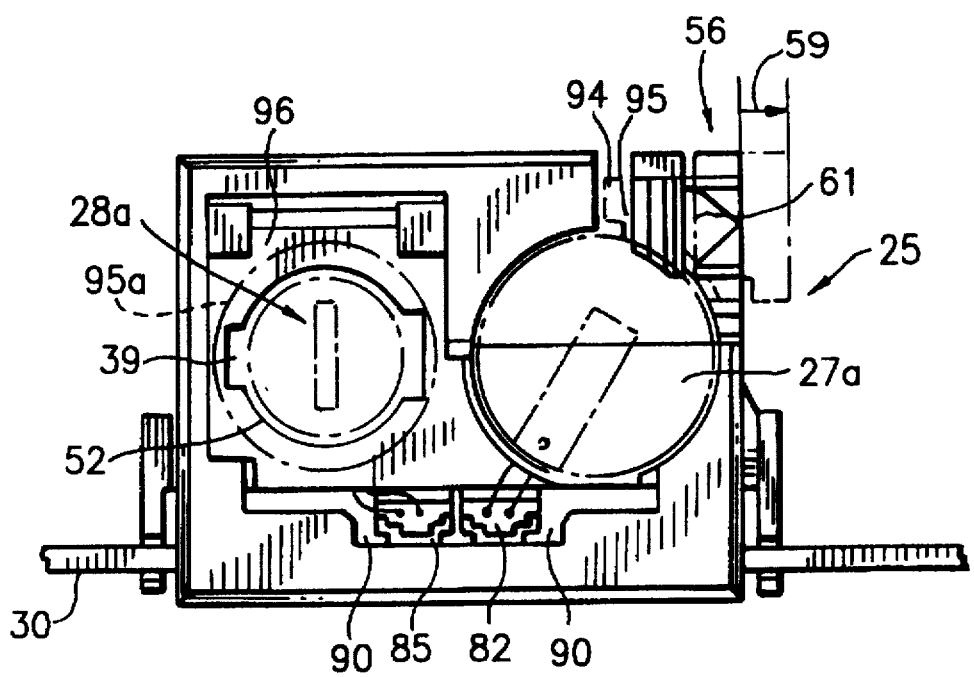

FIG. 5 is a front view of the device holder and circuit board of FIG. 3 showing a retention clip in normal position and, in phantom, in an actuated position and showing, in phantom, a battery inserted in a receptacle of the holder.

Figure 6:
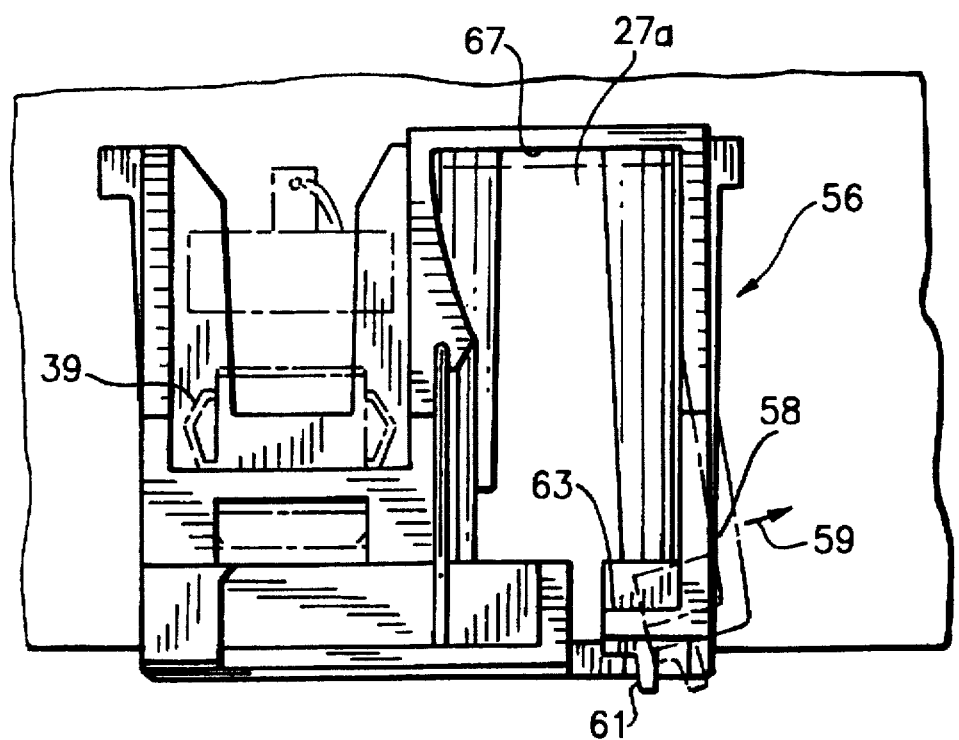

FIG. 6 is a top view of the device holder showing the retention clip again in the normal position and, in phantom, actuated.

FIGS. 7–12 show various devices that could be held by the device holder of the present invention.

BEST MODE FOR CARRYING OUT THE INVENTION

The device holder of the present invention is particularly well suited for holding a battery or other device, such as a keyswitch, in spaced relation to a printed circuit board thereby allowing the mounting of circuit components on the printed circuit board between the device holder and the printed circuit board. Additionally, the device holder allows for the easy installation and removal of a device in a chamber of the holder. Connector means are also provided so that an electrical connection can be easily established between a device being held and the printed circuit board.

Figure 1:
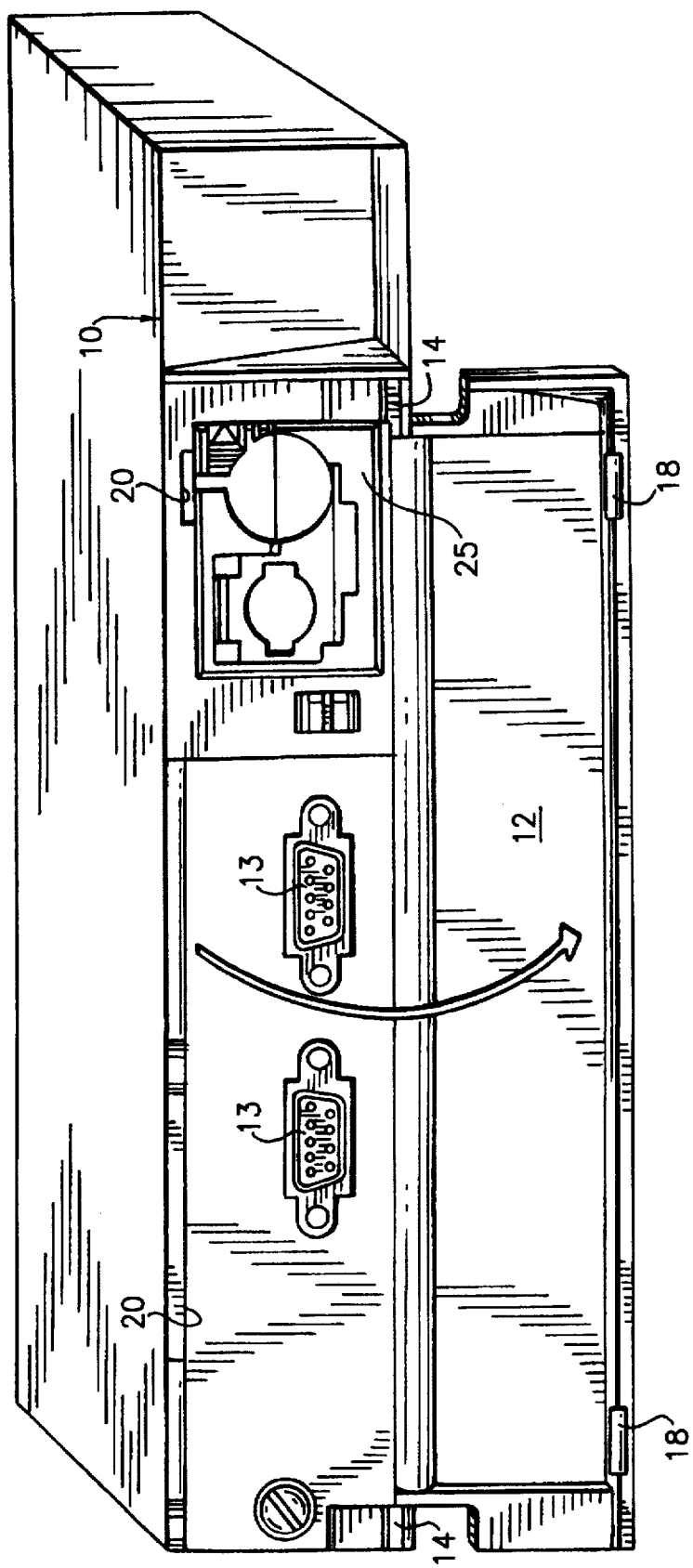
FIG. 1 is a front view of a housing containing a printed circuit board having the device holder of the present

Referring to FIG. 1, a housing 10 may be provided to house a printed circuit board having a device holder in accordance with the present invention. The housing 10 may be provided with an access door 12 which allows access to the device holder 25 and various other connectors or components 13 mounted on or connected to the printed circuit board. Additionally, the housing 10 may be provided with a suitable access (not shown) for connection of the printed circuit board to a back plane. Alternatively, the housing and printed circuit board may be provided with various types of connections known in the art (not shown) for connection of the printed circuit board in various circuit configuration as desired.

The access door 12 is mounted to the housing 10 via hinges 14 for allowing swinging movement of the access door 12 with respect to the housing 10. Fastening means 18, e.g., tabs, may be provided on the access door for mating engagement with retention surfaces 20 on the housing for holding the access door in contact with the housing in a closed position (not shown).

As shown in FIG. 1, when the access door 12 is in the open position, access is provided to the device holder 25 for allowing the insertion and removal of devices such as a battery and a keylock.

Referring to FIGS. 2 and 3, the device holder 25 is provided with a combination of mounting means for mounting to a printed circuit board 30. Although not illustrated in FIG. 2, the printed circuit board typically includes a plurality of circuit components mounted on one side 31, and electrical connections between the various circuit components on both sides thereof. The mounting means for mounting the device holder 25 to the printed circuit board 30 includes a channel 32 on a forward side of the device holder 25 which is configured to receive a side or edge 35 of the printed circuit board 30. On a rear side of the device holder 25 a pair of deformable fastening means 37 are provided to be received in a pair of apertures 40 formed in the printed circuit board for snap fit engagement therebetween. As illustrated in FIG. 4, when the device holder 25 is mounted to the printed circuit board 30, the forward edge 35 (FIG. 2) of the printed circuit board is securely received in the channel 32, and the deformable fastening means 37 are received in the apertures 40 (FIG. 2) and engage the printed circuit board for providing secure retention of the device holder 25 on the printed circuit board. The fastening means 32, 37 cooperate to hold the device holder 25 in spaced relation to the printed circuit board 30 so that a space 43 (FIG. 4) is provided therebetween. In this way, various circuit components 47, 49 may be mounted on the printed circuit board 30 between the printed circuit board 30 and the device holder 25.

Referring again to FIG. 2, the device holder 25 includes a pair of juxtaposed chambers 50, 51, each chamber being configured to receive a device. One chamber 50, is configured to receive a device 28 having press spring fins 33 that engage with cutouts 39 (FIG. 3) formed in the one chamber 50. The other chamber is configured to receive a cylindrical device 27 such as a battery. The internal dimensions of each chamber 50, 51 are slightly larger than the external dimensions of the device it is designed to hold so that each device is securely retained therein and the movement of a held device is extremely limited when inserted in a chamber. The device holder 25 is also provided with a retention clip 56 for retaining the cylindrical device 27 within the chamber 51.

Referring also to FIG. 3, the device holder 25 is shown including a chamber 50 shaped to hold an encapsulated keylock device 28, in which a keylock 34 is fit into a variable diameter container 26. The encapsulated keylock device 28 has, attached to terminals 29 on an end of the device opposite the keylock 34, electrical conductors 78 (wires) that lead to a male plug 82 which plugs into a female receptacle 85 shown on the printed circuit board 30. When the encapsulated keylock device 28 is inserted into the chamber 50, a pair of press spring fins 33 on the sides of the encapsulated keylock device 28 deform as they engage a surface 41 of the cutouts 39. Once the press spring fins 33 have been inserted far enough into the chamber, the action of a rear spring surface 36 of the press springs 33 is to further pull the device into the chamber. This action continues until a back face 95 (FIG. 7) of the device 28 mates with a front face 96 (FIG. 5) of the device holder 50, this mating resisting further travel of the device 28 into the chamber 50, and this resistance combined with the continuing pull of the press spring fins 33 serving to hold the device 28 securely in the chamber 50.

The press spring fins 33 are made of a suitable resiliently deformable material to provide the desired spring action for securely retaining the device 28 within the chamber 50. FIG. 5 shows the keyswitch in phantom 28a with its front face 95a, of circular cross section, larger in diameter than a circular cutout 52 in the device holder 50, so that the device 28a cannot be pushed farther into the holder than where the back 95 (FIG. 7) of its front face 95a mates with the front face 96 of the device holder cutout 52.

Referring also to FIGS. 5 and 6, a resiliently deformable arm 58 of the retention clip 56 is deformable in response to a force applied by an operator for insertion of a cylindrical device 27 within the chamber 51. In FIGS. 5 and 6, the retention clip 56 is shown in its normal (non-actuated) position and also shown, in phantom, in its deformed or displaced (actuated) position. In FIGS. 5 and 6, the retention clip 56 is shown as including an extension tab 61 for engagement with a finger of an operator so that the retention clip may be easily repositioned for insertion of a battery into the chamber 51.

During insertion or removal of a cylindrical device 27, such as a battery, into the chamber 51, a force is applied to the tab 61 in the direction of the arrow 59 of FIG. 6. Once the retention clip 56 is repositioned as shown in phantom in FIGS. 5 and 6, the entrance to chamber 51 is clear so that a cylindrical device may be inserted. In FIG. 5, a cylindrical device is shown in phantom at 27a after being inserted into the chamber 51.

Referring to FIGS. 2 and 6, when the retention clip 56 is returned to its normal position, a back surface 63 of the retention tab 61 engages a forward end of the cylindrical device to thereby securely hold the cylindrical device inside the chamber. The distance between a back end 67 of the chamber 51 and the back surface 63 of the retention clip 56 is slightly greater than the axial length of the cylindrical device 27 to thereby limit the axial movement of the cylindrical device 27 when positioned within the chamber 51.

If the cylindrical device 27 is a battery, on either side of it electrical contact means 72 are mounted thereon for providing an electrical contact. Attached to one end of each electrical contact means 72 is a conductor 78 for providing an electrical path between the battery 27 and a known type of connector 82. As illustrated in FIG. 2, a male connector 82 is attached to the electrical conductors 78, and a female connector 85 is mounted on the printed circuit board. Upon engagement of the male connector 82 with the female connector 85 a complete circuit path is provided between the battery 27 and the printed circuit board 30. Various electrical connections (not shown) may be provided between the female connector 85 mounted on the printed circuit board and various circuit components (not shown) mounted on the printed circuit board 30.

Referring again to FIG. 5, when the device holder 25 is mounted to the printed circuit board 30, a cutout section 90 is provided in the front of the device holder 25 to thereby provide for the connection and removal of the male connector 82 from the female connector 85. Therefore, access is provided for installation and removal of the battery and keylock from the device holder 25 without removal of the printed circuit board from the housing 10.

The invention provides for electrically mounting to the circuit board various devices as shown in FIGS. 7-12. For example, as shown in FIGS. 7 and 10, a light emitting diode 85 mounted in a container of cylindrical shape 87 (FIG. 10) or in a container with a varying radius 26 (FIG. 7) may be provided. Additionally, a rheostat 89 as shown in FIGS. 8 and 11 also mounted in a container of either shape, or as shown in FIGS. 9 and 12 an on/off switch 93 mounted in a container of either shape. Also shown in FIG. 12, for a device in a cylindrical container 91, is a tab 94 (key) that provides that the container can be inserted in the chamber 51 in only one orientation, the chamber 51 including a channel 95 (key way) as shown in FIG. 5 into which the tab 94 is inserted. The key 94 and key way 95 control the orientation and prevent rotation of the cylindrical device. These various devices can each be held by the invention alone or in combination with other devices and can each function alone or in combination with the other devices. Each can be removed, furthermore, from the device holder 25 without having to remove the device holder from the printed circuit board 31, and without having to remove the printed circuit board from the housing 10.

Although the invention is illustrated herein as having chambers 50, 51 shaped to hold the particular devices 27,28 described for this embodiment, it will be understood by those skilled in the art that the invention will work equally as well with chambers shaped for receiving other devices, e.g., a rectangular or square shaped chamber for receiving a rectangular or square shaped device. Additionally, it is apparent that the invention would also work equally as well with more than two chambers provided for receiving various devices.

Additionally, although the invention is shown with electrical contacts 72 attached by, e.g. soldering or by use of a conductive adhesive, to each end of any battery being held, it is apparent that the invention would work equally as well if the electrical contacts 72 mate mechanically with the poles of a battery.

Although the invention has been described and illustrated with respect to exemplary embodiments thereof, it should be understood by those skilled in the art that the foregoing and various other changes and omissions may be made therein and thereto without departing from the spirit and scope of the present invention.

What is claimed is:

1. A device holder for mounting on a printed circuit board comprising:

at least one chamber having a chamber open end for receiving a device therein;

mounting means for mounting the device holder to the printed circuit board, said mounting means holding said at least one chamber in spaced relation to said printed circuit board, thereby allowing the mounting of circuit components on the printed circuit board between the device holder and the printed circuit board, said mounting means including:

(a) first mounting means on a front end of the device holder adjacent to said chamber open end, said first mounting means having a channel formed therein for engaging an edge of the printed circuit board;

(b) second mounting means on a rear end of the device holder opposite to said front end, said second mounting means being received in apertures formed in the printed circuit board and being configured for snap fit engagement therewith; and (c) wherein said first mounting means and said second mounting means cooperate to securely hold the device holder to the printed circuit board with said at least one chamber in spaced relation to the printed circuit board.

2. A device holder according to claim 1 for holding a device having resiliently deformable retention means, wherein said chamber open end includes a device retention surface for engagement with said resiliently deformable retention means for holding said device within said at least one chamber.

3. A device holder for mounting on a printed circuit board comprising:

at least one chamber having a chamber open end for receiving a device therein;

mounting means for mounting the device holder to the printed circuit board, said mounting means holding said at least one chamber in spaced relation to said printed circuit board, thereby allowing the mounting of circuit components on the printed circuit board between the device holder and the printed circuit board; and retention clip means positioned adjacent to said chamber open end, said retention clip means preventing a device from being inserted in and removed from said at least one chamber through said chamber open end when said retention clip means is in a non-actuated position, said retention clip means allowing a device to be inserted in and removed from said at least one chamber through said chamber open end when said retention clip means is in an actuated position.

4. A device as claimed in claim 3 wherein said retention clip means comprises:

a retention tab;

a resiliently deformable arm mounted on one end to a rear side of the device holder and having said retention tab mounted on the other end thereof, said arm holding said retention tab adjacent to said chamber open end; and a contacting surface on a rear side of said retention tab for engagement with an end of a device installed in said at least one chamber when said retention clip means is in said non-actuated position.

5. A device holder according to claim 4 wherein the internal dimensions of said at least one chamber are slightly larger than the external dimensions of a device to be received therein for limiting the movement of a device within said at least one chamber, and wherein the distance between a surface of said rear side of the device holder and said contacting surface is slightly longer than the length of a device to be received in said at least one chamber.

6. A device holder according to claim 4 wherein the printed circuit board is mounted within a housing, and wherein an access is provided in said housing for accessing the device holder, whereby a device is installed in, and removed from, said at least one device chamber without removing the printed circuit board from said housing.

7. A device holder according to claim 6 wherein a connector is mounted on the printed circuit board for engagement with a device connector, which is connected via a pair of electrically conducting leads to terminals of a device, and wherein the device holder further comprises a cutout for providing access to the connector mounted on the printed circuit board when the device holder is mounted to the printed circuit board.

8. A device holder for mounting on a printed circuit board comprising:

at least one chamber having a chamber open end for receiving a device therein;

mounting means for mounting the device holder to the printed circuit board, said mounting means holding said at least one chamber in spaced relation to said printed circuit board, thereby allowing the mounting of circuit components on the printed circuit board between the device holder and the printed circuit board; and a connector mounted on the printed circuit board for engagement with a device connector, which is connected via a pair of electrically conducting leads to terminals of a device, and wherein the device holder further comprises a cutout for providing access to the connector mounted on the printed circuit board when the device holder is mounted to the printed circuit board.

9. A device holder according to claim 8 wherein said cutout is provided on a side of the device holder adjacent to said chamber open end.

10. A device holder according to claim 8 wherein the printed circuit board is mounted within a housing, and wherein an access is provided in said housing for accessing the device holder and the connector mounted on the printed circuit board, whereby a device is installed in and removed from said at least one chamber, and the device connector may be connected to and disconnected from the connector mounted on the printed circuit board without removing the printed circuit board from the housing.

11. A device holder for mounting on a printed circuit board comprising:

at least one chamber having a chamber open end for receiving a device therein, said device having resiliently deformable retention means, wherein said chamber open end includes a device retention surface for engagement with said resiliently deformable retention means for holding said device within said at least one chamber; and mounting means for mounting the device holder to the printed circuit board, said mounting means holding said at least one chamber in spaced relation to said printed circuit board, thereby allowing the mounting of circuit components on the printed circuit board between the device holder and the printed circuit board.

12. A device holder according to claim 11 wherein the printed circuit board is mounted within a housing, and wherein an access is provided in said housing for accessing the device holder, whereby a device is installed in and removed from said at least one device chamber without removing the printed circuit board from said housing.

13. A device holder according to claim 11 wherein said resiliently deformable retention means includes a pair of spring fins and wherein said device further includes a face plate having a back face, said spring fins and said back face cooperating to grip said retention surface for holding said device within said at least one chamber.

14. A device holder according to claim 11 wherein the internal dimensions of said at least one chamber are slightly larger than the external dimensions of a device to be received therein for limiting the movement of the device within said at least one chamber.

15. A device holder according to claim 14 wherein said at least one chamber is cylindrical in shape for receiving a cylindrically shaped device.

16. A device holder according to claim 11 wherein a connector is mounted on the printed circuit board for engagement with a device connector, which is connected via a pair of electrically conducting leads to terminals of a device, and wherein the device holder further comprises a cutout for providing access to the connector mounted on the printed circuit board when the device holder is mounted to the printed circuit board.

17. A device holder according to claim 16 wherein said cutout is provided on a side of the device holder adjacent to said chamber open end.

18. A device holder according to claim 11 wherein the printed circuit board is mounted within a housing, and wherein an access is provided in said housing for accessing the device holder, whereby a device is installed in, and removed from, said at least one device chamber without removing the printed circuit board from said housing.

19. A device holder according to claim 18 wherein a connector is mounted on the printed circuit board for engagement with a device connector, which is connected via a pair of electrically conducting leads to terminals of a device, and wherein the device holder further comprises a cutout for providing access to the connector mounted on the printed circuit board when the device holder is mounted to the printed circuit board.

20. A device holder for mounting on a printed circuit board comprising:
- at least one device retaining chamber having a device retaining chamber open end for receiving a device therein;
- retention clip means positioned adjacent to said device retaining chamber open end, said retention clip means preventing a device from being inserted in and removed from said at least one device retaining chamber through said device retaining chamber open end when said retention clip is in a non-actuated position, said retention clip allowing a device to be inserted in and removed from said at least one device retaining chamber through said device retaining chamber open end when said retention clip is in an actuated position;
- at least one device mounting chamber having a device mounting chamber open end for receiving a self-retaining device of the type having resiliently deformable retention means, wherein said device mounting chamber open end includes a device retention surface for engagement with said resiliently deformable retention means for holding said self-retaining device within said at least one device mounting chamber;
- mounting means for mounting the device holder to the printed circuit board, said mounting means holding said chambers in spaced relation to said printed circuit board, thereby allowing the mounting of circuit components on the printed circuit board between the device holder and the printed circuit board.

21. A device holder according to claim 20 wherein said mounting means comprises
- first mounting means on a front end of the device holder adjacent to said device retaining chamber and device mounting chamber open ends, said first mounting means having a channel formed therein for engaging an edge of the printed circuit board;
- second mounting means on a rear end of the device holder opposite to said front end, said second mounting means being received in apertures formed in the printed circuit board and being configured for snap fit engagement therewith; and
- wherein said first mounting means and said second mounting means cooperate to securely hold the device holder to the printed circuit board with said chambers in spaced relation to the printed circuit board.

22. A device holder according to claim 20 wherein said resiliently deformable retention means includes a pair of spring fins and wherein said self-retaining device further includes a face plate having a back face, said spring fins and said back face cooperating to grip said retention surface for holding said self-retaining device within said at least one device mounting chamber.

23. A device holder according to claim 20 wherein the printed circuit board is mounted within a housing, and wherein an access is provided in said housing for accessing the device holder, whereby a device is installed in and removed from said at least one device retaining chamber and said at least on device mounting chamber without removing the printed circuit board from said housing.

24. A device as claimed in claim 20 wherein said retention clip means comprises:
- a retention tab;
- a resiliently deformable arm mounted on one end to a rear side of the device holder and having said retention tab mounted on the other end thereof, said arm holding said retention tab adjacent to said device retaining chamber open end; and
- a contacting surface on a rear side of said retention tab for engagement with an end of a device installed in said at least one device retaining chamber when said retention clip means is in said non-actuated position.

25. A device holder according to claim 24 wherein said resiliently deformable retention means includes a pair of spring fins and wherein said self-retaining device further includes a face plate having a back face, said spring fins and said back face cooperating to grip said retention surface for holding said self-retaining device within said at least one device mounting chamber.

26. A device holder according to claim 25 wherein the printed circuit board is mounted within a housing, and wherein an access is provided in said housing for accessing the device holder, whereby a device is installed in and removed from said at least one device retaining chamber and said at least on device mounting chamber without removing the printed circuit board from said housing.

* * * * *